(12) United States Patent
Gravrand et al.

(10) Patent No.: US 8,441,089 B2
(45) Date of Patent: May 14, 2013

(54) MULTILAYER BISPECTRAL PHOTODIODE DETECTOR

(75) Inventors: Olivier Gravrand, Fontanil-Cornillon (FR); Jacques Baylet, Grenoble (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 0 days.

(21) Appl. No.: 13/220,340

(22) Filed: Aug. 29, 2011

(65) Prior Publication Data

US 2012/0068295 A1   Mar. 22, 2012

(30) Foreign Application Priority Data

Sep. 16, 2010   (FR) ...................................... 10 57392

(51) Int. Cl.
    *H01L 31/102*   (2006.01)
(52) U.S. Cl.
    USPC ........... 257/440; 257/431; 257/442; 257/443; 257/461; 257/E31.055; 257/E31.057; 257/E31.067
(58) Field of Classification Search .................. 257/431, 257/440, 442, 443, 461, E31.055, 57, 67
    See application file for complete search history.

(56) References Cited

U.S. PATENT DOCUMENTS

| | | | | |
|---|---|---|---|---|
| 6,034,407 A | * | 3/2000 | Tennant et al. | ............... 257/440 |
| 2005/0045910 A1 | * | 3/2005 | Taylor et al. | .................. 257/184 |

FOREIGN PATENT DOCUMENTS

EP   0747962 A2   12/1996

OTHER PUBLICATIONS

Republique Francaise, Rapport De Recherche Preliminaire Internationale Search Report, dated May 26, 2011, 2 pgs.
Status of HgCdTe Bicolor and Dual-Band Infrared Focal Arrays at Leti, G. Destefanis, et al., Journal of Electronic Materials, vol. 36, No. 8, 2007, pp. 1031-1044.
Electrical Doping of HgCdTe by Ion Implantation and Heat Treatment, G.L. Destefanis, Journal of Crystal Growth 86 (1988), pp. 700-721.
Recent Advances in the Development of Infrared Multispectral $128^2$ FPAs, J. Baylet, et al., 10 pgs.

* cited by examiner

*Primary Examiner* — Minchul Yang
(74) *Attorney, Agent, or Firm* — Harris Beach PLLC

(57) ABSTRACT

This bispectral detector comprises a plurality of unitary elements for detecting a first and a second electromagnetic radiation range, consisting of a stack of upper and lower semiconductor layers of a first conductivity type which are separated by an intermediate layer that forms a potential barrier between the upper and lower layers; and for each unitary detection element, two upper and lower semiconductor zones of a second conductivity type opposite to the first conductivity type, are arranged respectively so that they are in contact with the upper faces of the upper and lower layers so as to form PN junctions, the semiconductor zone being positioned, at least partially, in the bottom of an opening that passes through the upper and intermediate layers. The upper face of at least one of the upper and lower layers is entirely covered in a semiconductor layer of the second conductivity type. Cuts are made around each unitary detection element from the upper face of the stack and at least through the thickness of each semiconductor layer of the second conductivity type, entirely covering one or other of the upper and lower semiconductor layers of the first conductivity type, so as to form semiconductor zones of the second conductivity type.

9 Claims, 5 Drawing Sheets

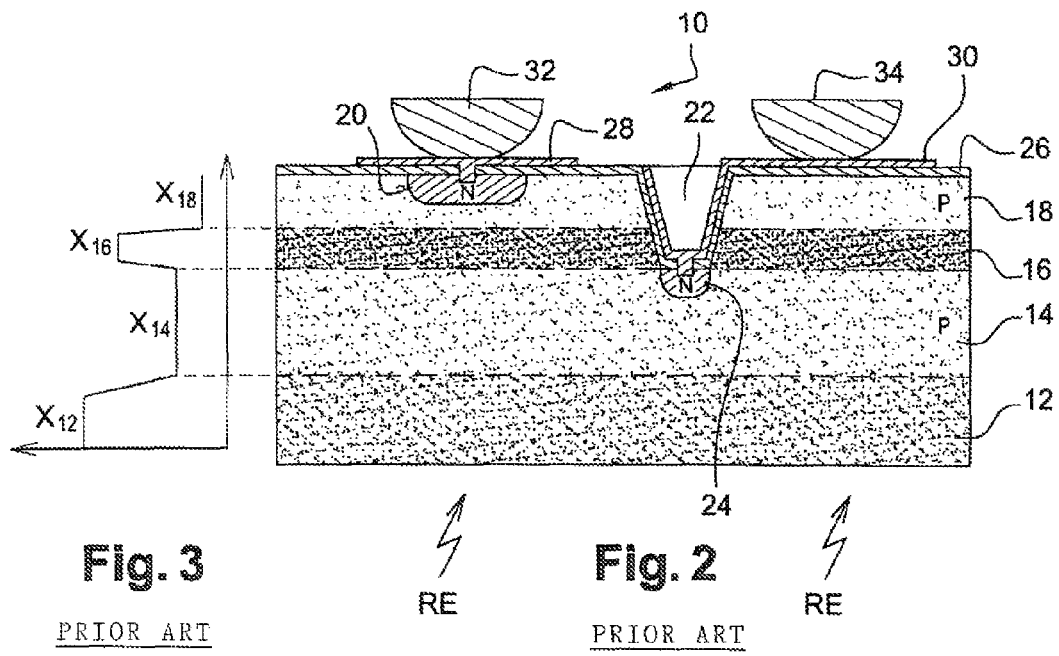
Fig. 3
PRIOR ART
Fig. 2
PRIOR ART
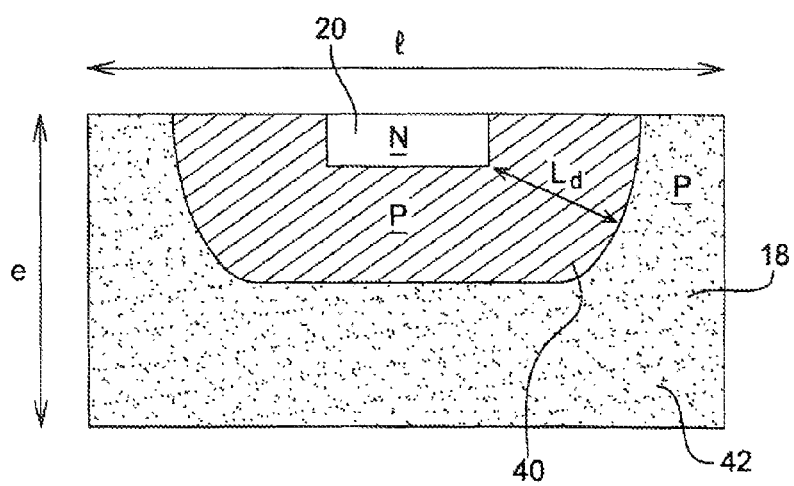
Fig. 4
PRIOR ART

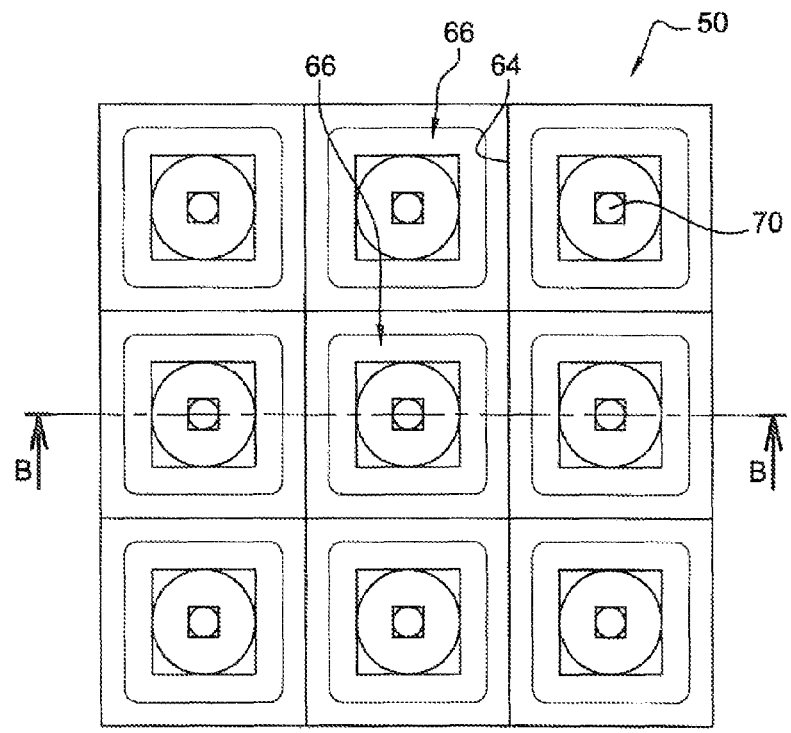
Fig. 5
PRIOR ART
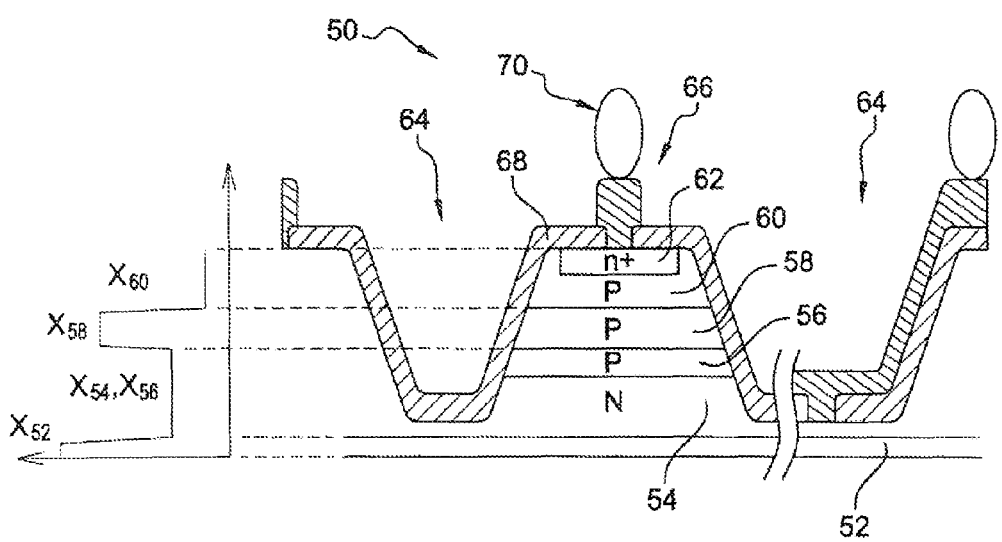
Fig. 7
PRIOR ART
Fig. 6
PRIOR ART

MULTILAYER BISPECTRAL PHOTODIODE DETECTOR

CROSS REFERENCE TO RELATED APPLICATION

This application claims benefit of French Patent Application No. 1057392, filed on Sep. 16, 2010. The entirety of this application is incorporated herein by reference.

FIELD OF THE INVENTION

The invention relates to the field of bispectral detection and, more especially, bispectral detection using unitary detection elements consisting of a stack of different absorption layers.

DESCRIPTION OF PRIOR ART

Bispectral detection and, in particular, detection in two separate infrared ranges such as the mid infrared range (2.5-5.5 µm) and the far infrared range (8-12 µm), has many applications, especially in the field of earth observation, meteorology, etc.

Ideally, the images formed by a bispectral detector in each of its two detection ranges are spatially coherent, i.e. they correspond to the same observed scene, temporally coherent, i.e. they correspond to the same detection instant, and have a high resolution, i.e. they consist of a large number of unitary detection elements, or pixels, per unit of surface area.

Detectors comprising two detection arrays, each dedicated to one wavelength range and organized as two separate optical channels with synchronized readout were initially proposed in order to meet these constraints. However, such detectors make it necessary to perform fine adjustment of the optical channels so that their optical centers point towards the same point in space in order to achieve the sought-after spatial coherence. Such detectors are bulky. In addition, not only is adjusting the optical channels awkward, the optical channels also lose adjustment during use of the detector and this necessitates their frequent return to the manufacturer.

In order to obtain spatial coherence more simply, a single detection array whereof the pixels are capable of detecting two separate wavelength ranges, i.e. pixels comprising, in a single space, two semiconductor absorption volumes, each dedicated to one specific wavelength range and associated with one PN junction for charge collection, has been devised.

Obviously, the pixels must be separate from one another from the point of view of detection and crosstalk phenomena must be prevented as much as possible.

Two types of bispectral detector have been developed in order to meet these constraints. In the first type of detector, the pixels have a "parallel" architecture. In the second type of detector, the pixels have a "head-to-foot" architecture.

The term "parallel" indicates that, for a bispectral pixel comprising two photodiodes, the two photodiodes are adjacent in the main plane of the stack and that each of the photodiodes is associated with individual interfacing that makes it possible to address the photodiodes separately. This pixel geometry therefore makes it possible to address the two photodiodes simultaneously, hence the term "parallel". On the other hand, this geometry is less compact.

The term "head to foot" indicates that, for a bispectral pixel comprising two photodiodes, the two photodiodes are formed vertically one above the other and that only a single interface is provided in order to address these two photodiodes. This pixel geometry, devised to ensure compactness, nevertheless necessarily involves arranging the photodiodes "head to foot", i.e. the cathode of one photodiode faces the anode of the other photodiode. This geometry is more compact but the photodiodes cannot be individually addressed because, by subjecting the stack to a given potential difference, one photodiode is forward biased and the other photodiode is reverse biased. The photodiodes are therefore addressed sequentially by varying the sign of the potential difference to which the stack is subjected.

Also, classically, there are two ways of fabricating a plurality of photodiodes, namely "planar" type fabrication and "mesa" type fabrication which result in a "planar" and a "mesa" type photodiode geometry respectively.

The term "planar" denotes that the photodiodes are fabricated by producing doped zones in a semiconductor layer and that the geometry of a doped zone formed in the semiconductor layer is bounded by a pattern formed in a photoresist deposited on the semiconductor layer and the doped zone is created through this photoresist pattern, for example by ion implantation, diffusion or ion beam milling.

The term "mesa" denotes that a doped layer is produced over an entire semiconductor layer and that the photodiodes are separated by etching which cuts through them, thus creating "islands" (or "mesas") which delimit the doped zones of the photodiodes.

Thus, a distinction is made between "parallel" or "head-to-foot" bispectral pixel geometries and the way in which the photodiodes that constitute them are created, namely "planar" or "mesa" fabrication.

In order to understand the problems that are encountered with existing bispectral detectors, a "parallel" bispectral array detector 10 as described, for example, in the document entitled "Status of HgCdTe bicolor and dual-band infrared array at LETI" by Destefanis, JEM 36(8), p. 1031, 2007 will now be described in relation to FIGS. 1 to 4.

FIG. 1 is a top view of this detector, represented here in the form of a two-dimensional three-pixel by three-pixel detector, FIG. 2 is a cross-sectional view along line A-A in FIG. 1, FIG. 3 is a profile showing the cadmium composition x of various alloys of cadmium, mercury and tellurium ($Cd_xHg_{1-x}Te$) that form the stack of detector 10, and FIG. 4 is a cross-sectional view showing the space charge region in a PN junction of one pixel.

Detector 10 comprises a stack formed by:
- a substrate 12 consisting of an alloy of cadmium, zinc and tellurium or "CZT" alloy,
- a P-type semiconductor lower absorption layer 14 formed on substrate 12. Layer 14 consists of a $Cd_xHg_{1-x}Te$ alloy P-doped due to mercury vacancies and having a low energy gap. The $x_{14}$ cadmium composition of layer 14 is selected so that the layer has absorbing properties in a first wavelength range around a wavelength $\lambda_{14}$;
- an intermediate layer 16 forming a barrier produced on lower layer 14. Layer 16 consists of a material having a high energy gap, for example a CdxHg1-xTe alloy whereof the $x_{16}$ composition is high in relation to cadmium compositions $x_{14}$, $x_{18}$ of layers 14 and 18; and
- an upper P-type semiconductor absorption layer 18 formed on layer 16 that forms a barrier. Layer 18 consists of a $Cd_xHg_{1-x}Te$ alloy P-doped due to mercury vacancies and having a low energy gap. The $x_{18}$ cadmium composition of layer 18 is selected so that the layer has absorbing properties in a second wavelength range around a wavelength $\lambda_{18}$.

N-type semiconductor zones 20 are also produced in upper layer 18, for example by boron ion implantation. This ion implantation step has the effect of converting the P-type intrinsic doping to N-type doping and thus forms an array of upper PN junctions and hence photodiodes. This realization of N-type zones 20 could also be performed by ion implantation of extrinsic dopants or by diffusion of extrinsic dopants or by ion beam milling and converting the P-type doping to N-type doping.

Openings 22 are also etched through upper layer 18 and all or part of intermediate layer 16. Contacts are also etched down to layer 14 in order to provide access to the latter. N-type semiconductor zones 24 are made in lower layer 14 by applying the same method as that used for layers 20 to all or part of lower layer 14 that just touches the bottom of openings 22. An array of lower PN junctions, and hence photodiodes, is thus formed in lower layer 14.

A passivation layer 26 (not shown in FIG. 1 for the sake of clarity) is also deposited on the exposed face of upper layer 28 and in openings 22.

Finally, a metallic contact pad 28 is formed on upper layer 18 above each zone 20 and penetrates into zone 20 in order to collect the charges contained therein. Similarly, a metallic contact pad 30 is deposited in each opening 22 and penetrates into corresponding zone 24 in order to collect the charges contained in that zone. Contact pad 30 extends on the upper face of layer 18 in order to facilitate connection of pad 30 to external interfacing (not shown). Finally, an indium bump 32, 34 is used on that part of each pad 28, 30 formed on upper layer 18 in order to hybridize the stack on a readout circuit (not shown) by using flip chip technology.

Detector 10 described above is a backside illuminated sensor. The exposed face of substrate 12 receives electromagnetic radiation RE which penetrates the stack. The portion of radiation RE contained in the first wavelength range is absorbed by lower layer 14, and the portion of radiation RE contained in the second wavelength range is absorbed by upper layer 18.

As is known in itself, the absorption of photons in lower layer 14 and upper layer 18 releases charge carriers that diffuse into semiconductor zones 20, 24 and are collected via contact pads 28, 30. A bias voltage is or is not applied between a common peripheral contact (not shown in FIG. 2) and contact pads 28, 30 in a manner that is known in itself.

The role of intermediate layer 16 is to prevent the charge carriers created in one of layers 14, 18 from diffusing into the other layer 14, 18, thereby producing a phenomenon known as crosstalk which is detrimental to detection quality. This function is more commonly referred to as a "barrier".

The quality of the bather function of intermediate layer 16 depends mainly on the difference between the band gap value of intermediate layer 16, that of lower layer 14 and that of upper layer 18. Intermediate layer 16 forms a potential barrier that separates the valence and conduction bands of lower layer 14 and upper layer 16, thus limiting the movement of charge carriers from one layer to another.

In a $Cd_xHg_{1-x}Te$ type semiconductor alloy, the band gap value is chiefly determined by the mercury composition (1-x) or, equivalently, by the cadmium composition x. FIG. 3 illustrates a typical profile for the cadmium compositions x of the various layers of the stack with intermediate layer 16 having an $x_{16}$ composition that is preferably at least 50% higher than each of the $x_{14}$, $x_{18}$ compositions of lower layer 14 and upper layer 18.

Openings 22 are necessary in order to access lower layer 14, thus making it possible to produce semiconductor zones 24 and produce contact pads 30 to collect the charges in zones 24.

Detector 10 described above has the advantages of having a simple geometry and therefore being easy to fabricate, guaranteeing good, but not perfect, spatial coherence because semiconductor zones 20 and 24 are offset by half a pitch interval and guaranteeing precise temporal coherence because the photodiodes are biased independently.

Besides imprecise spatial coherence, detector 10 also has the disadvantage of having a non-optimal packing density. Here, the term "packing density" is taken to mean the ratio of the optical surface area of a pixel, i.e. the area over which the absorbed radiation is actually collected by a PN junction, to the geometrical surface area of that pixel defined, for instance, by the pixel pitch squared in the case of a square shaped pixel.

This phenomenon is explained in relation to FIG. 4 which schematically shows a more detailed cross-sectional view of one of semiconductor zones 20 or 24, for example zone 20, and the corresponding upper layer 18 or lower layer 14, for example layer 18.

As is known in itself, the photodiode shown in FIG. 4 works by collecting, via zone 20, the current created by the free charge carriers generated by the absorption of photons in layer 18. The charge carriers only travel through the material that constitutes layer 18 for a maximum distance $L_d$, commonly referred to as the "diffusion length", before recombining. In fact, if a charge carrier is created in layer 18 at a distance from zone 20 that is less than distance $L_d$, the charge carrier is collected by zone 20, otherwise the charge carrier recombines before it reaches zone 20 and is therefore not collected. Thus only the volume of layer 18 around zone 20 is used for detection and this volume is commonly referred to as the "collection area". The rest of layer 18, referred to here as 42, is therefore not utilized.

It is possible to maximize collection area 40, thereby achieving a better packing density for the photodiode in question, by heat treating the detector at an appropriate temperature as described, for instance, in the document entitled "*Electrical doping of HgCdTe by ion implantation and heat treatment*" by G. L. Destefanis, J. Crystal Growth, 86, 1988, 700-722.

Nevertheless, the optimal heat treatment temperature depends on the composition of the layer through which the charge carriers move. However, layers 14 and 18 have different compositions in order to detect different wavelengths ranges. It is therefore not possible to optimize the collection areas for each of the photodiodes.

The actual structure of detectors that have pixels with a "parallel" geometry in the example illustrated with two "planar" type diodes necessarily results in an unsatisfactory packing density and imprecise spatial coherence.

As mentioned earlier, the second type of architecture according to the prior art is "head-to-foot" architecture.

In order to elucidate the problems encountered with "head-to-foot" type detectors, a bispectral array detector of the "head-to-foot" type 50 will now be described in relation to FIGS. 5 to 7, for example the detector described in the document entitled "*Recent advances in the development of infrared multispectral $128^2$ FPAs*" by J. Baylet et al, Proceedings of the society of photo-optical instrumentation engineers, vol. 4721, pp 134-143, 2002.

FIG. 5 is a top view of this detector, represented here in the form of a two-dimensional three-pixel by three-pixel detector, FIG. 6 is a cross-sectional view along line B-B in FIG. 5, and FIG. 7 is a profile showing the cadmium composition x of various alloys of cadmium, mercury and tellurium ($Cd_xHg_{1-x}Te$) that form the stack of detector 50.

Detector 50 comprises a substrate 52 consisting of a CZT alloy whereon the following are formed in the order listed below:

a first semiconductor layer 54 consisting of an N-doped $Cd_xHg_{1-x}Te$ alloy having cadmium composition $x_{54}$;

a second semiconductor absorption layer 56 consisting of a P-doped $Cd_xHg_{1-x}Te$ alloy having cadmium composition $x_{56}$ selected to ensure absorption in a first wavelength range, with the cadmium composition of layer 56 being equal to or greater than the cadmium composition of layer 54;

an intermediate layer 58 forming a barrier and consisting of a $Cd_xHg_{1-x}Te$ alloy having a high energy gap, whereof the $x_{58}$ composition is high in relation to cadmium compositions $x_{56}$, $x_{60}$ of layers 56 and 60; and a third semiconductor absorption layer 60 consisting of a P-doped $Cd_xHg_{1-x}Te$ alloy having cadmium composition $x_{60}$ selected to ensure absorption in a second wavelength range.

N-type semiconductor zones 62 are produced in third layer 60 and cuts 64 are made in the stack around zones 62 as far as layer 54 in order to form pixels in the form of islands 66. Each pixel thus comprises a first photodiode, consisting of P- and N-type layers 54 and 56, and a second photodiode, consisting of P-type layer 60 and N-type zone 62.

A passivation layer 68 covers the entire assembly and a single metallic connection element 70 is formed on each island 66 which is in contact with zone 62 of the island in order to collect the charges produced both by first photodiode 54, 56 and by second photodiode 60, 62.

Finally, a common peripheral contact 67 is produced on the contact of layer 54 in order to apply a common potential to all the islands 66 during charge collection.

This "head-to-foot" type geometry has the advantage of being very compact, thus making it possible to realize a detector 50 with a high resolution, and allowing a very high packing density because the PN junctions are produced by two P- and N-type layers 54 and 56 deposited one on top of the other. Moreover, exact spatial coherence is obtained because absorption layers 56 and 60 are superposed.

Nevertheless, "head-to-foot" geometry also poses specific problems.

In fact, the stack of one island 66 with an NP-PN pattern forms two photodiodes that are head to foot. More especially, when a photodiode formed by layers 54 and 56 is forward biased, the photodiode formed by layer 60 and zone 62 is reverse biased and vice versa.

It is therefore impossible to simultaneously collect the charges produced by each of the photodiodes. Collection is therefore performed sequentially by reversing the sign of the potential difference between contact 70 and contact 67, one photodiode after the other, and so detection in the two wavelength ranges is not temporally coherent.

Also, the pixels are individualized by cuts 64 which are made, for example, by etching around each pixel and are thus in the form of an island 66.

This type of geometry is difficult to fabricate because of its high form factor, i.e. because cuts 64 have a high depth-to-width ratio.

Firstly, the depth of the cuts is considerable because they have to be formed at least as far as N-type layer 54. It is therefore necessary to etch at least layers 56 and 60, which are the thickest layers because of their absorption function, in order to isolate the islands from each other. Then, in order not to waste any absorbent material, thus preserving good quantum efficiency, it is preferable to form cuts 64 so they have a minimal width. These two constraints in terms of depth and width therefore make it necessary to produce cuts that have a high form factor, for instance cuts that are 10 micrometers deep and 2 micrometers wide. Etching this type of cut and respecting the geometrical constraints, on the one hand, and avoiding introducing structural or composition defects into the materials of the islands, on the other hand, are very difficult. Not only that, depositing passivation layer 68 over the entire surface of a cut that has a high form factor is also difficult.

"Head-to-foot" type geometry is therefore difficult to fabricate and produces detection that is not temporally coherent.

SUMMARY OF THE INVENTION

The object of the present invention is to propose a bispectral detector that is simple to manufacture, has good temporal and spatial coherence and a high packing density.

To achieve this, the object of the invention is a bispectral detector comprising a plurality of unitary elements for detecting a first and a second electromagnetic radiation range, comprising:

a stack of upper and lower semiconductor layers of a first conductivity type in order to absorb a first and a second electromagnetic radiation range respectively and which are separated by an intermediate layer that forms a potential barrier between the upper and lower layers; and for each unitary detection element, two upper and lower semiconductor zones of a second conductivity type opposite to the first conductivity type, are arranged respectively so that they are in contact with the upper faces of the upper and lower layers so as to form PN junctions, the semiconductor zone that is in contact with the lower layer being positioned, at least partially, in the bottom of an opening that passes through the upper and intermediate layers.

According to the invention, the upper face of at least one of the upper and lower layers is entirely covered in a semiconductor layer of the second conductivity type;

and cuts are made around each unitary detection element from the upper face of the stack and at least through the thickness of each semiconductor layer of the second conductivity type, entirely covering one or other of the upper and lower semiconductor layers of the first conductivity type, so as to form semiconductor zones of the second conductivity type.

In other words, the detector according to the invention has, overall, the same structure as a "parallel" detector according to the prior art but with at least one of the upper and lower photodiodes having a "mesa" type geometry.

The effects of simply providing such a "mesa" geometry in a "parallel" detector are as follows:

temporal coherence is preserved because both the photodiodes can be biased separately;

the form factor is smaller, thus making fabrication simpler compared with "head-to-foot" geometry according to the prior art, because it is not necessary to etch the two absorption layers, because the stack of photodiodes is of the NPNP type. the depth of the cuts is therefore reduced;

the packing density is maximized by making provision for:
a. two mesa type photodiodes, each formed by two superposed P- and N-type layers,
b. or one mesa type photodiode formed by two superposed P- and N-type layers with the other photodiode being produced by implantation and having an optimized collection area, for example by applying a heat treatment; and if the application so demands, exact spatial coherence because the photodiodes can be perfectly superposed.

In a first embodiment of the invention:
  only the upper face of the upper layer is covered in a semiconductor layer of the second conductivity type;
  cuts are made around each unitary detection element, at least through the thickness of the semiconductor layer of the second conductivity type, so as to form upper semiconductor zones;
  and lower semiconductor zones are produced, at least partially, in the bottom of the openings that pass through the upper and intermediate layers.

In a second embodiment of the invention:
  only the upper face of the lower layer is substantially covered in a semiconductor layer of the second conductivity type;
  cuts are made around each unitary detection element, at least through the thickness of the semiconductor layer of the second conductivity type, so as to form lower semiconductor zones;
  and upper semiconductor zones are produced on the upper face of the upper layer.

In particular, the doping of the upper or lower layer in which the semiconductor zones of the second conductivity type are produced, especially by using a "planar" type method, is chosen so that the charge carrier diffusion length in said layer is maximized In a third embodiment of the invention:
  the upper face of the upper layer and the upper face of the lower layer are each substantially covered in a semiconductor layer of the second conductivity type;
  and cuts are made around each unitary detection element from the upper face of the stack at least as far as the lower layer, so as to form upper and lower semiconductor zones.

The object of the invention is also a method for manufacturing a bispectral detector comprising a plurality of unitary elements for detecting a first and a second electromagnetic radiation range, involving:
  producing a stack of upper and lower semiconductor layers of a first conductivity type in order to absorb a first and a second electromagnetic radiation range respectively and which are separated by an intermediate layer that forms a potential barrier between the upper and lower layers; and
  for each unitary detection element, forming two upper and lower semiconductor zones of a second conductivity type opposite to the first conductivity type, arranged respectively so that they are in contact with the upper and lower layers so as to form PN junctions.

According to the invention:
  the upper face of at least one of the upper and lower layers is substantially entirely covered in a semiconductor layer of the second conductivity type;
  and cuts are made around each unitary detection element from the upper face of the stack and at least through the thickness of each semiconductor layer of the second conductivity type, entirely covering one or other of the upper and lower semiconductor layers of the first conductivity type, so as to form semiconductor zones of the second conductivity type.

In one embodiment of the invention, each of the upper and lower layers covered by a semiconductor layer of the second conductivity type is formed by epitaxy, with the semiconductor layer of the second conductivity type that covers it being produced by introducing dopants during epitaxial growth.

In one embodiment of the invention:
  the upper face of one of the upper and lower layers is substantially covered in a semiconductor layer of the second conductivity type, with cuts being made around each unitary detection element at least through the thickness of the semiconductor layer of the second conductivity type;
  the semiconductor zones that are in contact with the other layer of the upper and lower layers are produced in the latter;
  and a heat treatment is applied to this assembly so that the other of the upper and lower layers has a charge carrier diffusion length that is maximized in said layer.

More particularly, the semiconductor zones that are in contact with the other of the upper and lower layers are produced by forming patterns in a photoresist that is deposited on the other of the upper and lower layers which delimit semiconductor zones and by doping the other of the upper and lower layers through the photoresist patterns, especially by ion implantation, diffusion or ion beam milling

BRIEF DESCRIPTION OF THE DRAWINGS

The invention will be made more readily understandable by the following description which is given merely by way of example and relates to the accompanying drawings in which identical references denote identical or analogous components and in which:

FIGS. 1 and 2 are top and cross-sectional views of a "parallel" type array detector according to the prior art such as that described above in the preamble;

FIG. 3 is a profile of the cadmium composition of the layers of the stack of the detector shown in FIGS. 1 and 2, as described above in the preamble;

FIG. 4 is a detailed cross-sectional view of FIG. 2 showing a collection area such as that described above in the preamble;

FIGS. 5 and 6 are top and cross-sectional views of a "head-to-foot" type array detector according to the prior art such as that described above in the preamble;

FIG. 7 is a profile of the cadmium composition of the layers of the stack of the detector shown in FIGS. 5 and 6, as described above in the preamble;

DESCRIPTION OF THE PREFERRED EMBODIMENTS

As stated above, the invention essentially involves combining a "parallel" type pixel geometry with at least one photodiode having a "mesa" type geometry.

Figure 1:
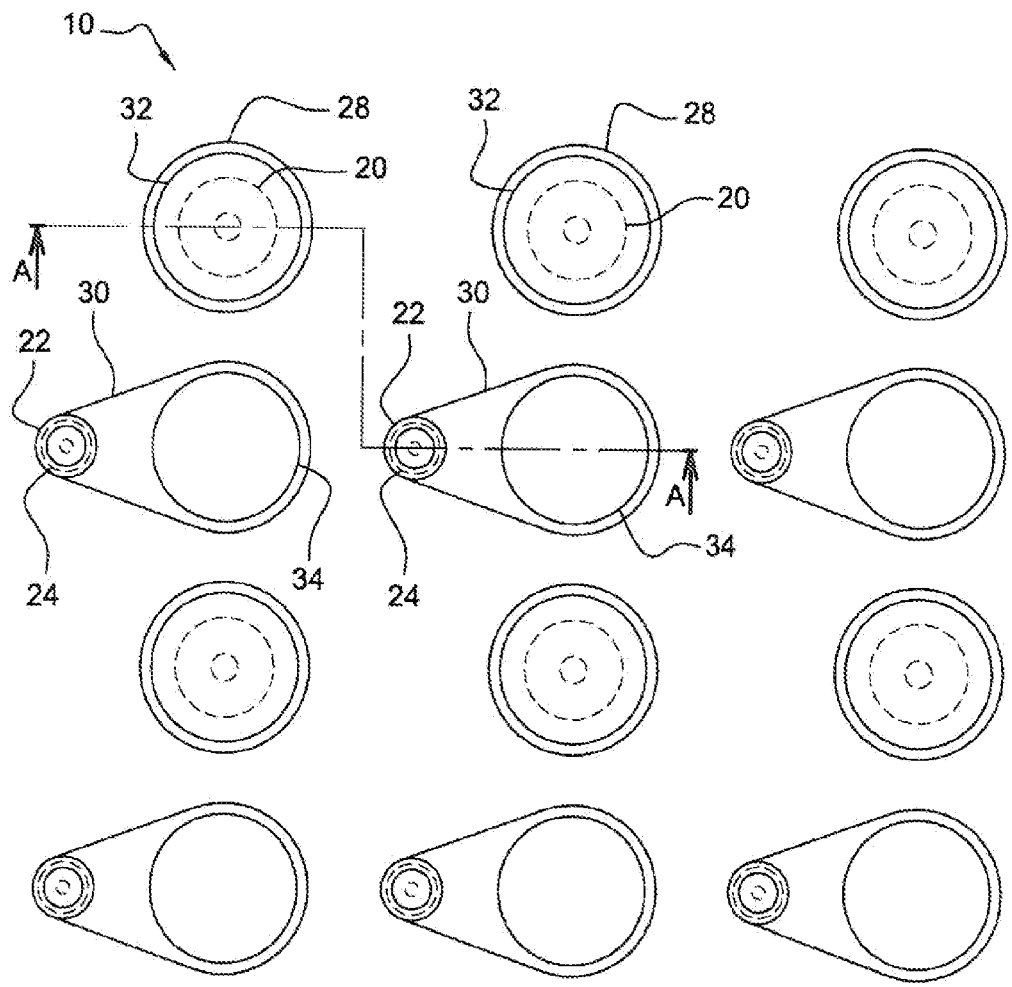

According to the invention, the "parallel" type array detector according to the prior art described in relation to FIGS. 1 to 3 is modified by making cuts around each pixel of the detector in order to define at least one "mesa" type photodiode.

First Embodiment

Figure 8:
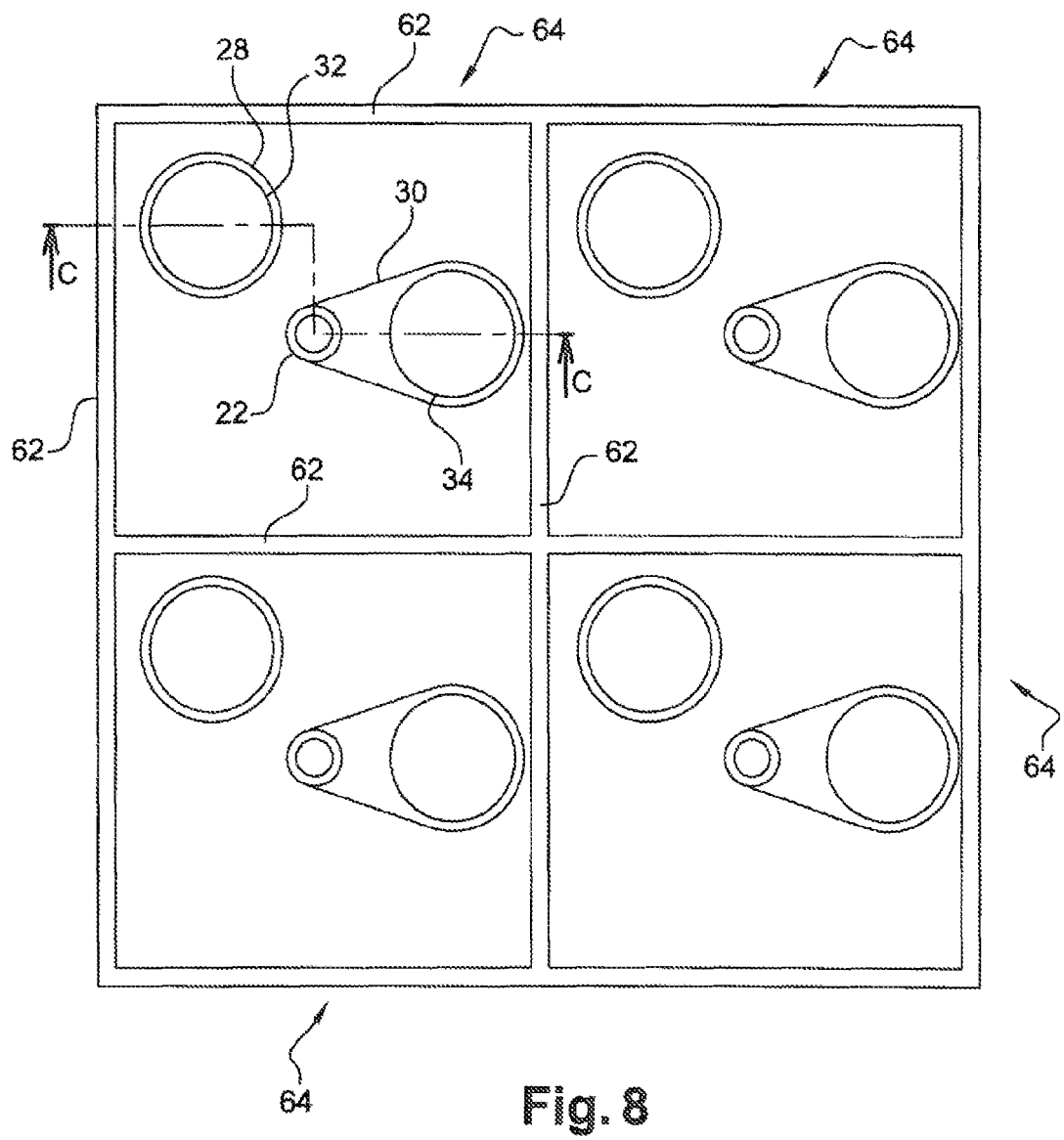
FIGS. 8 and 9 are top and cross-sectional views of an array detector according to a first embodiment of the invention.
Figure 9:
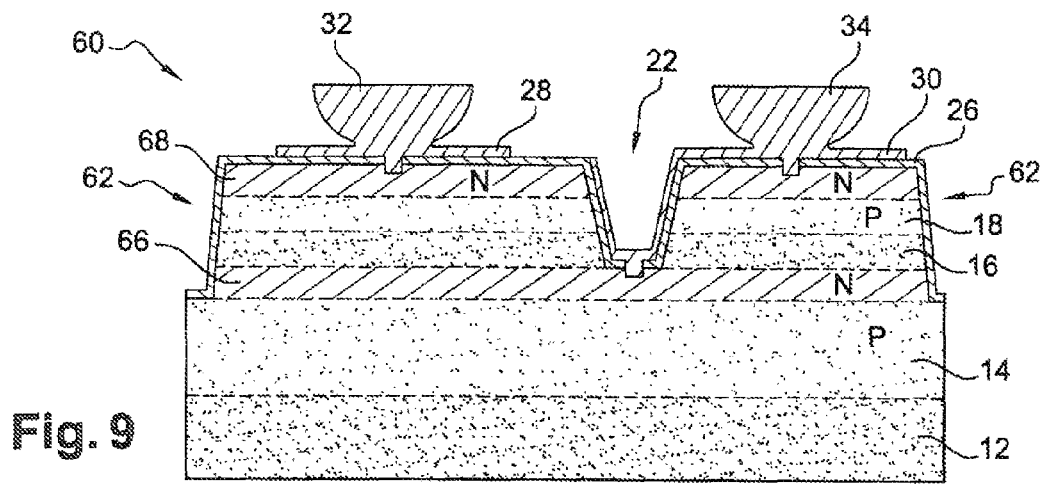

A detector 60 according to a first embodiment of the invention is described below making reference to FIGS. 8 and 9. FIG. 8 is a top view showing an array of two pixels by two pixels and FIG. 9 is a cross-sectional view along line C-C in FIG. 8.

Detector 60 differs from detector 10 in FIGS. 1 to 3 by virtue of the shape of the N-type semiconductor zones implanted in layers 14 and 18 of the stack and the presence of cuts 62 around each pixel 64.

More especially, N-type zones 20 and 24 according to the prior art are, respectively, replaced by N-type layers 66 and 68 which entirely cover P-type absorption layers 14 and 18.

Advantageously, N-type layer 66 and P-type layer 14, as well as N-type layer 68 and P-type layer 18, are produced during a single epitaxial growth step by introducing appropriate dopants into the $Cd_xHg_{1-x}Te$ alloy in order to obtain the desired cadmium composition and N- or P-type properties.

The pixels are then individualized by etching cuts 62 in the upper face of the assembly as far as P-type layer 14 and the surface of cuts 62 is also covered by passivation layer 26.

The first embodiment thus has "mesa" type upper and lower photodiodes without suffering from the disadvantage of needing a high form factor.

This embodiment has numerous advantages:
  simple fabrication of all the layers 14, 66, 16, 18, 68, for example by epitaxy with adjustment of the dopants, followed by formation of cuts 62, for example by etching, as far as P-type layer 14. Because P-type layer 14 does not have to be etched in order to isolate the pixels from each other, the depth of cuts 62 is therefore limited;
  exact spatial coherence because photodiodes 14, 66 and 18, 68 are superposed;
  exact temporal coherence because there are two separate contact pads per pixel; and
  in view of the given thickness of P-type absorption layers 14 and 18, an optimal packing density for each of the photodiodes because N-type layers 66, 68 cover the entire surface of P-type absorption layers 14 and 18.

In order to minimize the depth of cuts 62 and increase the packing density of pixels 64, it is also possible to reduce the thickness of absorption layer 18.

Note that openings 22 have a form factor that is more advantageous than that of cuts 62. Firstly, their depth is less by design because they only extend roughly halfway through the stack. Secondly, they are also wider because patterns (like the contact pad in zone 24 for example) have to be defined at the bottom of the opening. This necessitates photolithography and implantation or etching steps, the dimensions of which are of the order of several micrometers. They are therefore also wider than cuts 62 because there is no need to define patterns in the bottom of said cuts for technological reasons.

Second Embodiment

In the embodiment described above, the form factor of cuts 62, although considerably reduced compared with the prior art used in "head-to-foot" type detectors, may still be considered to be too high.

Figure 10:
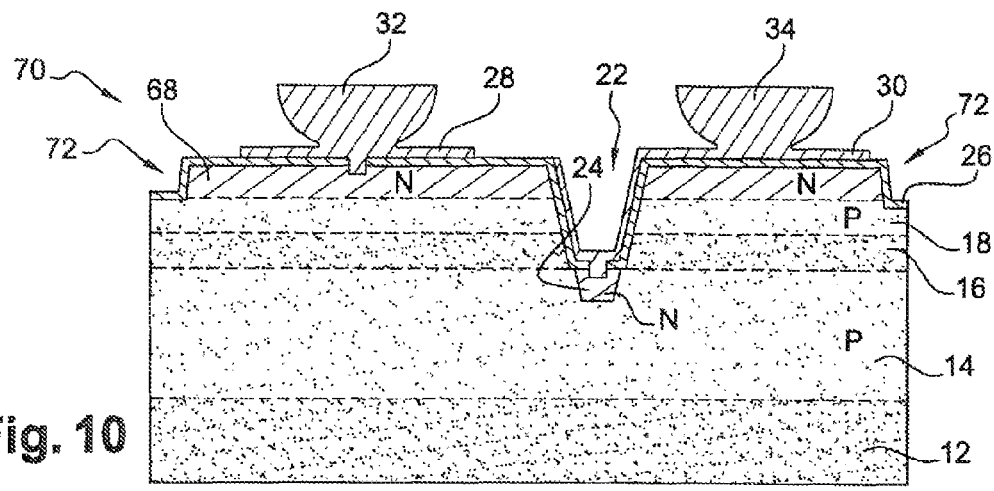
FIG. 10 is a schematic cross-sectional view of an array detector according to a second embodiment of the invention.

A second embodiment, illustrated by the cross-sectional view in FIG. 10, differs from the first embodiment in that the N-type semiconductor zones 24 produced in contact with absorption layer 14 in order to form the lower PN junctions are produced at the bottom of openings 22 by using a "planar" type method, in a similar way to zones 24 according to the prior art, by extrinsic doping with N-dopants, for example by ion implantation or by ion implantation and converting the P-type intrinsic doping to N-type doping or by diffusion.

Zones 24 have a diameter of 2 to 10 micrometers for example.

The upper photodiodes are then individualized by etching cuts 72 in the upper face of the assembly as far as upper absorption layer 18. The depth of cuts 72 is therefore shallow and cuts 72 are even more simple to produce. The upper photodiodes then have a "mesa" type geometry and the lower photodiodes have a "planar" type geometry.

The packing density of upper photodiodes 68, 18 is optimal here by design, bearing in mind the desired thickness for absorption layer 18.

Also, the packing density of lower photodiodes 24 is advantageously maximized by increasing the diffusion length $L_d$ in layer 14 by applying an appropriate heat treatment such as that described, for instance, in the document entitled "*Electrical doping of HgCdTe by ion implantation and heat treatment*" by G. L. Destefanis, J. Crystal Growth, 86, 1988, 700-722.

Compared with the first embodiment, both spatial and temporal coherence are preserved. Also, the optimal packing density of the lower photodiodes is preserved because there is only a single "planar" type diode in the structure and it is therefore possible to optimally adjust the diffusion length in layer 14, thus maximizing the way that photodiodes 24 are packed.

This solution also has the specific advantage that cuts 72 that are made to separate the islands that form the upper diodes are particularly shallow because they only pass through upper N-type layer 68. This simplifies the fabrication process and higher yields are more easily obtainable.

In the example described, the absorption layer is a P-type layer. Obviously, it is possible to reverse the doping by providing N-type absorption layers. In this case, because the diffusion length in an N-type semiconductor material is usually far greater than the diffusion length in a P-type semiconductor material, cuts 72 can advantageously be made through layer 16 that forms a barrier as far as lower absorption layer 14 in order to reduce possible crosstalk.

Third Embodiment

Figure 11:
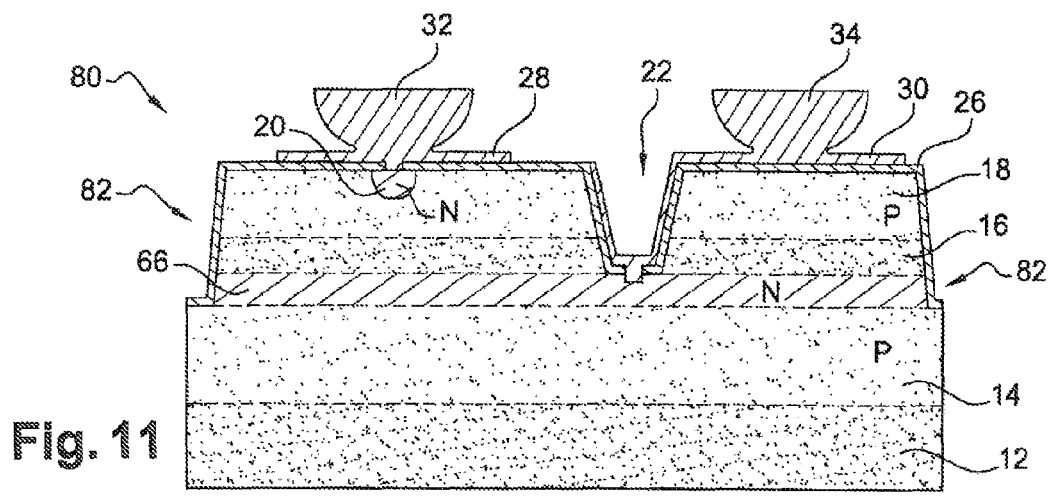
FIG. 11 is a top view of an array detector according to a third embodiment of the invention.

In the third embodiment, illustrated by the cross-sectional view in FIG. 11, the structure of detector 80 is inverted compared with detector 70 in the second embodiment.

More especially, the upper photodiodes are of the "planar" type with N-type semiconductor zones 20 implanted in absorption layer 18 in a similar manner to those according to the prior art. The lower photodiodes are of the "mesa" type and are formed by N-type layer 66 which covers P-type absorption layer 14, with cuts 82 being made in the upper face of the assembly as far as layer 14 in order to individualize the pixels.

Here, the packing density of lower photodiodes 66, 14 is optimal by design, bearing in mind the desired thickness for absorption layer 14, and the packing density of upper photodiodes 20, 18 is advantageously maximized by increasing the diffusion length $L_d$ in layer 18 by applying an appropriate heat treatment such as that described, for instance, in the document entitled "*Electrical doping of HgCdTe by ion implantation and heat treatment*" by G. L. Destefanis, J. Crystal Growth, 86, 1988, 700-722.

As in the second embodiment, both spatial and temporal coherence are preserved compared with the first embodiment. Also, the optimal packing density of the lower photodiodes is preserved because there is only a single "planar" type diode in the structure and really optimal adjustment of the diffusion length in layer 18 is possible, thus maximizing the way that photodiodes 20 are packed.

This solution also has the specific advantage that the edge of the upper P/N junction does not touch the flank of opening 22. The area close to the flank of the opening is, because of the etching and passivation steps that are used to construct it, an area that is more likely than the rest of the structure to contain material flaws which might result in electro-optical defects during operation of the photodiodes. Moving the edge of the P/N junction away from this area therefore results in improved performance of photodiode arrays built in this way.

By way of example, in the three embodiments that are described above:
  the pixel pitch is 15 to 30 micrometers;

openings 22 are, for example, cylindrical and have a diameter of 4 to 12 micrometers;

the cuts used to individualize the pixels have a width of 2 to 5 micrometers;

lower layer 14 is 5 micrometers thick and has a cadmium composition $x_{14}$ of 0.3. Layer 14 is thus adjusted for a wavelength of 5.1 micrometers at a temperature of 77 K and has an energy gap $E_g$=0.24 eV, thus allowing detection in the mid infrared range;

upper layer 18 is 3 micrometers thick and has a cadmium composition $x_{18}$ of 0.22. Layer 18 is thus adjusted for a wavelength of 10.7 micrometers at a temperature of 77 K and has an energy gap Eg=0.11 eV, thus allowing detection in the far infrared range; and intermediate layer 16 is 1 micrometer thick and has a cadmium composition $x_{16}$ of 0.8. Layer 16 thus has an energy gap Eg=1.1 eV.

The numerical values indicated above allow detection in both the mid and far infrared ranges. Obviously, detection in other ranges is possible by selecting appropriate materials, especially in the short (from 1 to 2.5 micrometers at 77° K.), mid (from 2.5 to 5.5 micrometers at 77° K.), far (from 8 to 12 micrometers at 77° K.) and ultra far (beyond 12 micrometers at 77° K.) infrared ranges.

Similarly, embodiments in which the absorption layers are P-type layers are described above. The invention also applies to N-type layers.

Likewise, an application of the invention that uses $Cd_xHg_{1-x}Te$ alloys which are materials in which it is especially difficult to etch cuts having a high form factor is described above. Obviously, the invention also applies to other types of semiconductor materials.

The invention claimed is:

1. A bispectral detector comprising a plurality of unitary elements for detecting a first and a second electromagnetic radiation range, consisting of:
    a stack of upper and lower semiconductor layers of a first conductivity type in order to absorb a first and a second electromagnetic radiation range respectively and which are separated by an intermediate layer that forms a potential barrier between the upper and lower layers; and
    for each unitary detection element, two upper and lower semiconductor zones of a second conductivity type opposite to the first conductivity type, are arranged respectively so that they are in contact with the upper faces of the upper and lower layers so as to form PN junctions, the semiconductor zone that is in contact with the lower layer being positioned, at least partially, in the bottom of an opening that passes through the upper and intermediate layers,
    wherein the upper face of at least one of the upper and lower layers is entirely covered in a semiconductor layer of the second conductivity type;
    and wherein cuts are made around each unitary detection element from the upper face of the stack and at least through the thickness of each semiconductor layer of the second conductivity type, entirely covering one or other of the upper and lower semiconductor layers of the first conductivity type, so as to form semiconductor zones of the second conductivity type.

2. The bispectral detector as claimed in claim 1,
    wherein only the upper face of the upper layer is substantially covered in a semiconductor layer of the second conductivity type;
    wherein cuts are made around each unitary detection element, at least through the thickness of semiconductor layer of the second conductivity type, so as to form upper semiconductor zones;
    and wherein lower semiconductor zones are produced, at least partially, in the bottom of the openings that pass through the upper and intermediate layers.

3. The bispectral detector as claimed in claim 1,
    wherein only the upper face of lower layer is substantially covered in semiconductor layer of the second conductivity type;
    wherein cuts are made around each unitary detection element, at least through the thickness of semiconductor layer of the second conductivity type, so as to form lower semiconductor zones;
    and wherein upper semiconductor zones are produced on the upper face of upper layer.

4. The bispectral detector as claimed in claim 2, wherein the doping of upper layer or lower layer in which semiconductor zones are implanted is chosen so that the charge carrier diffusion length in said layer is maximized 5. The bispectral detector as claimed in claim 1,
    wherein the upper face of upper layer and the upper face of lower layer are each substantially covered in a semiconductor layer of the second conductivity type;
    and wherein cuts are made around each unitary detection element from the upper face of the stack at least as far as lower layer, so as to form upper and lower semiconductor zones.

6. A method for manufacturing a bispectral detector comprising a plurality of unitary elements for detecting a first and a second electromagnetic radiation range, involving:
    producing a stack of upper and lower semiconductor layers of a first conductivity type in order to absorb a first and a second electromagnetic radiation range respectively and which are separated by an intermediate layer that forms a potential barrier between the upper and lower layers; and
    for each unitary detection element, forming two upper and lower semiconductor zones of a second conductivity type opposite to the first conductivity type, arranged respectively so that they are in contact with the upper and lower layers so as to form PN junctions,
    wherein the upper face of at least one of the upper and lower layers is substantially entirely covered in a semiconductor layer of the second conductivity type;
    and wherein cuts are made around each unitary detection element from the upper face of the stack and at least through the thickness of each semiconductor layer of the second conductivity type, entirely covering one or other of the upper and lower semiconductor layers of the first conductivity type, so as to form semiconductor zones of the second conductivity type.

7. The method for manufacturing a bispectral detector as claimed in claim 6, wherein each of the upper and lower layers covered by a semiconductor layer of the second conductivity type is formed by epitaxy, with the semiconductor layer of the second conductivity type that covers it being produced by introducing dopants during epitaxial growth.

8. The method for manufacturing a bispectral detector as claimed in claim 6,
    wherein the upper face of one of the upper and lower layers is substantially covered in a semiconductor layer of the second conductivity type, with cuts being made around each unitary detection element at least through the thickness of the semiconductor layer of the second conductivity type;

wherein semiconductor zones that are in contact with the other layer of the upper and lower layers are produced in the latter;

and wherein a heat treatment is applied to this assembly so that the other of the upper and lower layers has a charge carrier diffusion length that is maximized in said layer.

9. The method for manufacturing a bispectral detector as claimed in claim 8, wherein the semiconductor zones that are in contact with the other of the upper and lower layers are produced by forming patterns in a photoresist that is deposited on the other of the upper and lower layers which delimit semiconductor zones and by doping the other of the upper and lower layers through the photoresist patterns, especially by ion implantation, diffusion or ion beam milling.

* * * * *